(12) United States Patent
Breidenassel et al.

(10) Patent No.: US 9,509,116 B2
(45) Date of Patent: Nov. 29, 2016

(54) LIGHT EMITTER AND METHOD FOR MANUFACTURING THE SAME

(71) Applicant: OSRAM GmbH, Munich (DE)

(72) Inventors: Andreas Breidenassel, Bad Abbach (DE); Jan Oliver Drumm, Homburg (DE)

(73) Assignee: OSRAM GMBH, Munich (DE)

( * ) Notice: Subject to any disclaimer, the term of this patent is extended or adjusted under 35 U.S.C. 154(b) by 498 days.

(21) Appl. No.: 13/855,747

(22) Filed: Apr. 3, 2013

(65) Prior Publication Data

US 2013/0265770 A1 Oct. 10, 2013

(30) Foreign Application Priority Data

Apr. 4, 2012 (DE) ........................ 10 2012 205 513

(51) Int. Cl.
| | |
|---|---|
| *H01S 5/00* | (2006.01) |
| *F21V 7/00* | (2006.01) |
| *H01S 5/022* | (2006.01) |
| *H01S 5/40* | (2006.01) |

(52) U.S. Cl.
CPC ............. *H01S 5/0014* (2013.01); *F21V 7/00* (2013.01); *H01S 5/0071* (2013.01); *H01S 5/02248* (2013.01); *H01S 5/02288* (2013.01); *H01S 5/0222* (2013.01); *H01S 5/4031* (2013.01)

(58) Field of Classification Search
CPC ............. H01S 5/0014; H01S 5/0071; H01S 5/02288; H01S 5/02248; H01S 5/0222; H01S 5/4031; F21V 7/00; Y10T 29/49789
See application file for complete search history.

(56) References Cited

U.S. PATENT DOCUMENTS

| | | | |
|---|---|---|---|
| 6,271,049 B1 | 8/2001 | Auracher et al. | |
| 6,307,197 B1 | 10/2001 | Krug et al. | |
| 6,501,781 B1 | 12/2002 | Maurer et al. | |
| 7,213,982 B2 | 5/2007 | Chen | |
| 7,860,144 B2 | 12/2010 | Kuehnelt et al. | |
| 8,076,166 B2 * | 12/2011 | Steegmuller et al. | 438/29 |

FOREIGN PATENT DOCUMENTS

| | | |
|---|---|---|
| DE | 19838518 A1 | 3/2000 |
| DE | 19844701 C1 | 7/2000 |

(Continued)

OTHER PUBLICATIONS

English language abstract of DE 102 48 769 B3 dated Jul. 15, 2004.

*Primary Examiner* — Christopher M Koehler
(74) *Attorney, Agent, or Firm* — Viering, Jentschura & Partner mbB

(57) ABSTRACT

A method for producing a radiation arrangement includes providing a first substrate, arranging a first radiation source or generating first electromagnetic radiation thereon, arranging a first deflection element on the first substrate in a beam path of the first electromagnetic radiation such that the first electromagnetic radiation is deflected in a direction away from the first substrate, providing a second substrate, forming a first coupling-out region in the second substrate at a predefined position, determining an actual position of the first coupling-out region, detecting the deflected first electromagnetic radiation as a result of which a beam path of the deflected first electromagnetic radiation can be determined, aligning the first radiation source and the first deflection element on the first substrate depending on the determined actual position of the first coupling-out region.

18 Claims, 9 Drawing Sheets

(56) References Cited

FOREIGN PATENT DOCUMENTS

| DE | 10248769 | B3 | 7/2004 |
| DE | 102004050118 | A1 | 3/2006 |
| DE | 102005031132 | A1 | 4/2006 |
| DE | 102006017293 | A1 | 7/2007 |
| EP | 0987801 | A2 | 3/2000 |

* cited by examiner

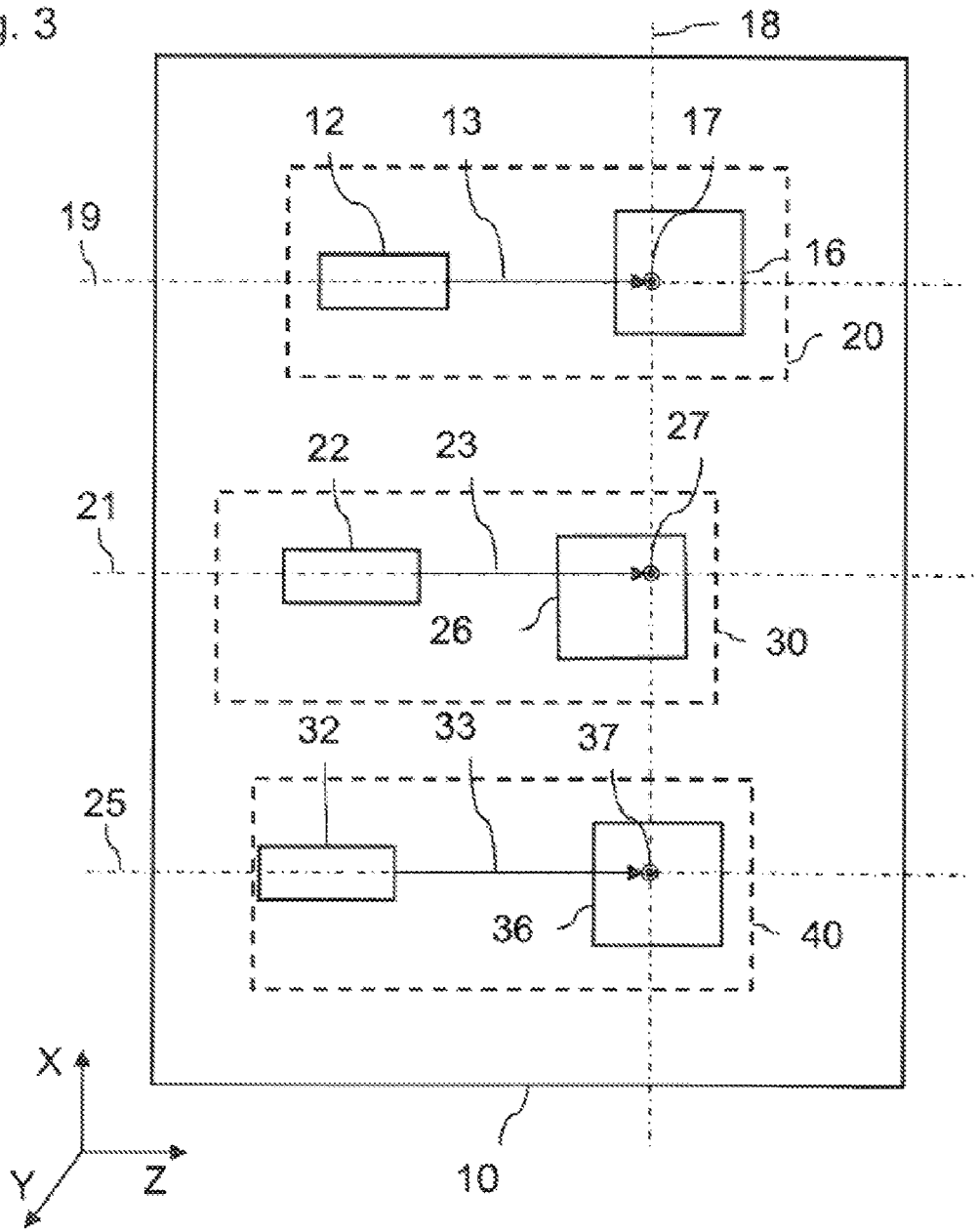

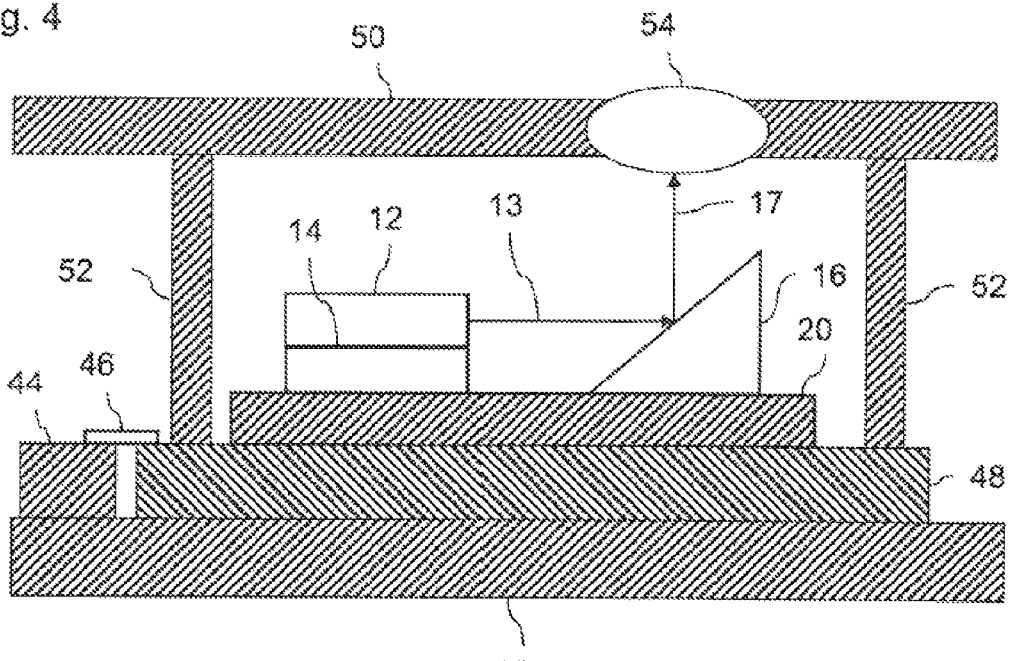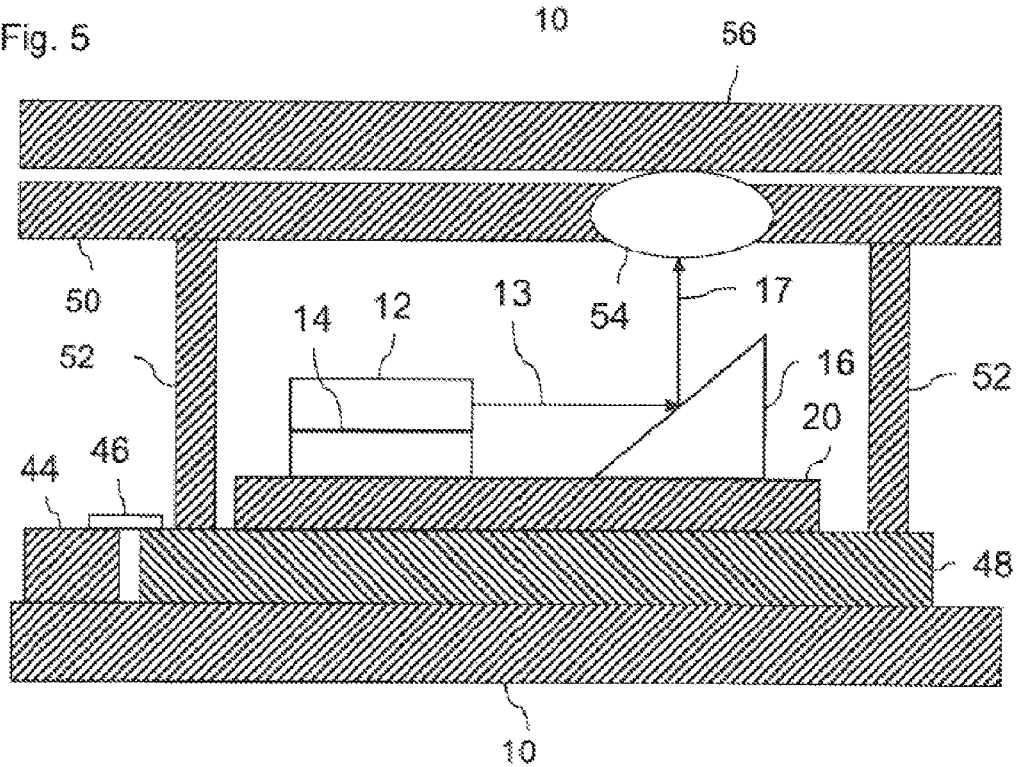

LIGHT EMITTER AND METHOD FOR MANUFACTURING THE SAME

RELATED APPLICATIONS

The present application claims priority from German application No. 10 2012 205 513.4 filed on Apr. 4, 2012.

TECHNICAL FIELD

Various embodiments relate to a method for producing a radiation arrangement, wherein a first substrate is provided and a first radiation source for generating first electromagnetic radiation is arranged on the first substrate. Furthermore, a second substrate is provided, in which a first coupling-out region is formed. The second substrate is arranged on the first substrate such that a beam path of the first electromagnetic radiation runs through the coupling-out region.

BACKGROUND

Radiation arrangements such as lasers and/or light sources, for example, are realized nowadays in a manner occupying an extremely small space. By way of example, it is known to form radiation arrangements in a manner similar to a microchip in large numbers on a wafer. The radiation arrangements formed on the wafer can be singulated, in which case each of the radiation arrangements can respectively have for example one, two or more lasers and/or light sources. As the dimensions of the radiation arrangements become smaller, however, problems increasingly occur. By way of example, unavoidable component tolerances become more and more dominant in comparison with the overall dimensions of the radiation arrangements. At the same time it becomes more and more difficult to align the extremely small components precisely with respect to one another. Consequently, it becomes more and more difficult to obtain precisely placed emission points in the radiation arrangements, which is of great importance, however, exactly in the case of radiation arrangements for high-precision applications. This may have the effect, for example, that a high level of rejects are produced during the production of the radiation arrangements for high-precision applications.

By way of example, the use of laser pico-projector modules in mobile terminals, for example in cellular phones, makes stringent requirements of the laser module (laser and optical unit) with regard to structural size, efficiency, image quality and costs. A particular challenge is posed here by the required image quality, which can be achieved only by high-precision arrangement of the laser source and the optical elements on the substrate used and with respect to one another. Such precision mounting can be impeded by inherent component fluctuations, for example. The high precision to be achieved for the arrangement whilst at the same time maintaining the possibility of manufacture in large numbers requires, in principle, a special module construction concept.

Optical requirements may demand, for example, that the radiation coupled out from an RGB laser module is collimatable, combinable and/or polarizable, for example circularly polarizable. The objectives of collimation and circular polarizability, in particular, lead in part to requirements made of the alignment accuracy of the optical elements and lasers in the micrometers range or below that. The collimation and/or combination can make stringent requirements of accuracy for example since the collimated combined beams can be directed for example onto a scanning device, which can represent a bottleneck in the beam path of the coupled-out electromagnetic radiation.

Manufacturing-dictated fluctuations of the geometrical dimensions of the lasers, for example with regard to the substrate thickness of the substrates used, prevent simple planar mounting of lasers and optical unit in the known production methods. In these methods, an additional alignment perpendicular to the surface of the substrate used always has to be effected as well, which is solved for example by applying adhesives and/or solders with different thicknesses. This vastly increases the complexity of the alignment process and, in particular, of the joining method, and can be carried out precisely only with high outlay.

A further requirement may be that lasers have to be operated in a hermetically protected atmosphere, since otherwise some lasers are subject to a high degree of wear.

SUMMARY

Various embodiments provide a method for producing a circuit arrangement which enables the radiation arrangement to be formed precisely in a simple manner and/or which enables the radiation arrangement to be formed with a precise emission point in a simple manner. Furthermore, various embodiments provide a radiation arrangement which can be produced simply and/or whose emission point is arranged precisely. Furthermore, high-precision mounting and manufacture of the radiation arrangement in the high volume range, that is to say in large numbers, whilst at the same time maintaining the advantageous properties such as small structural size, high efficiency and low manufacturing costs is possible. Furthermore, a radiation arrangement which exhibits a low degree of wear can be provided.

In various embodiments, a method for producing a radiation arrangement is provided, wherein a first substrate is provided and a first radiation source for generating first electromagnetic radiation is arranged on the first substrate. In addition, a first deflection element for deflecting the first electromagnetic radiation is arranged on the first substrate in a beam path of the first electromagnetic radiation such that the first electromagnetic radiation is deflected in a direction away from the first substrate. Furthermore, a second substrate is provided, in which a first coupling-out region is formed at a predefined desired position. In addition, an actual position of the first coupling-out region is determined. The deflected first electromagnetic radiation is detected, as a result of which a beam path of the deflected first electromagnetic radiation can be determined. The first radiation source and the first deflection element are aligned on the first substrate depending on the determined actual position of the first coupling-out region relative to one another and relative to the first substrate such that, with a second substrate arranged on the first substrate, the beam path of the deflected first electromagnetic radiation runs through the first coupling-out region. The second substrate is subsequently arranged on the first substrate.

The alignment of the first radiation source and of the first deflection element depending on the actual position of the first coupling-out region contributes to the beam path of the deflected first electromagnetic radiation running through the coupling-out region, wherein an effect of component tolerances of the first radiation source, of the first deflection element and/or of the first substrate is largely prevented.

Moreover, the alignment of the first radiation arrangement and of the first deflection element on the first substrate relative to one another and relative to the first substrate makes it possible to align the first radiation arrangement and the first deflection element exclusively in a plane parallel to the surface of the first substrate and nevertheless to place the emission point of the radiation arrangement precisely. This contributes to enabling the alignment of the first radiation source and of the first deflection element to be carried out in a particularly simple manner. The alignment of the radiation source and of the deflection element can thus be effected in a completely planar manner, that is to say parallel to the surface of the first substrate. An alignment perpendicular to the first substrate can be dispensed with. A particularly simple and expedient alignment process is realized as a result.

A minimal size of the radiation arrangement is only limited by the sizes of the radiation source and of the deflection element and of the encapsulation—explained in greater detail further below—of the radiation source and of the deflection element by means of a housing. The minimal size of the radiation arrangement contributes to a low material consumption and thus to low manufacturing costs.

The first radiation source may be for example a laser radiation source, a UV light source or a light source. The first deflection element may be for example a mirror or any reflective surface. The first substrate may be a wafer, for example, as a result of which it is possible to manufacture the radiation arrangement in high numbers in a simple manner. The first deflection element and/or the first radiation source may be aligned for example on the first substrate with the aid of horizontal stops.

The actual position of the first coupling-out region may be determined for example by forming the first coupling-out region in the second substrate and then measuring the first coupling-out region relative to the second substrate. As an alternative thereto, the actual position of the first coupling-out region can be determined for example by measuring the tool for producing the first coupling-out region. The data detected in this case can then be stored and, when the actual position of the first coupling-out region is determined in the future, the corresponding data can be loaded in a simple manner.

The deflected first electromagnetic radiation may be detected for example with the aid of light-sensitive sensors. Consequently, during the alignment of the first radiation arrangement and/or of the first deflection element, the deflected first electromagnetic radiation can be detected once, twice or several times, for example continuously, and the alignment process can be ended if the deflected first electromagnetic radiation is detected in a predetermined range and/or a corresponding signal of the sensor or sensors has a predefined form. The beam path of the first electromagnetic radiation may, but need not, be determined precisely. By way of example, an assignment of a suitably aligned beam path to a specific signal may be effected, the latter then being representative of the fact that the beam path runs as desired. In other words, the signal of the sensor for detecting the deflected first electromagnetic radiation is representative of a real course of the beam path of the deflected first electromagnetic radiation. The alignment of the first radiation arrangement and/or of the first deflection element may then be effected directly in a manner dependent on the signal of the sensor, without the need for the beam path to be determined separately.

In various embodiments, the first radiation source and/or the first deflection element may be aligned on the first substrate by being displaced on the first substrate parallel to a surface of the first substrate. This contributes in a simple manner to the precise alignment of the first radiation source and of the first deflection element and thus to a precise positioning of the emission point of the radiation arrangement. By way of example, horizontal stops may be used for aligning the first radiation source and/or the first deflection element.

In various embodiments, the first coupling-out region has a first coupling-out point, and the first radiation source and the first deflection element are aligned on the first substrate such that, with the second substrate arranged on the first substrate, the beam path of the deflected first electromagnetic radiation runs through the first coupling-out point. In other words, the first coupling-out region having the first coupling-out point exactly predefines the location through which the beam path of the deflected first electromagnetic radiation is intended to run, in particular through the first coupling-out point. The first radiation source and the first deflection element are then exactly aligned such that the beam path of the deflected first electromagnetic radiation, said beam path emerging from the radiation arrangement, runs exactly through the first coupling-out point.

In various embodiments, the first coupling-out region is formed in the second substrate by a coupling-out optical unit for coupling out the deflected first electromagnetic radiation being formed in the second substrate, wherein the coupling-out optical unit forms the first coupling-out region and has the first coupling-out point. By way of example, the second substrate may be a silicon substrate which is treated in the first coupling-out region in such a way that the first coupling-out region forms the coupling-out optical unit. The first coupling-out point may then lie for example in the center of the first coupling-out region or of the coupling-out optical unit. The coupling-out optical unit may be for example a focusing optical unit or a collimation optical unit and/or have a lens.

In various embodiments, the first coupling-out region is formed in the second substrate by a cutout for coupling out the first electromagnetic radiation being formed in the second substrate, wherein the cutout forms the first coupling-out region and includes the first coupling-out point. The coupling-out optical unit is arranged in a manner overlapping the cutout on the second substrate and is aligned depending on the coupling-out point on the second substrate. In other words, the coupling-out optical unit is formed independently of the second substrate and then placed onto the second substrate, wherein the coupling-out optical unit is arranged on the second substrate in a manner dependent on the first coupling-out point and corresponding to the beam path of the deflected first electromagnetic radiation. Consequently, the beam path of the deflected first electromagnetic radiation is adapted precisely to the first coupling-out point in a simple manner and the coupling-out optical unit is adapted precisely to the beam path of the deflected first electromagnetic radiation. This can contribute to a particularly precise arrangement of the emission point of the radiation arrangement.

As an alternative thereto, in various embodiments, the first coupling-out region is formed in the second substrate by a cutout for coupling out the first electromagnetic radiation being formed in the second substrate. The coupling-out optical unit for coupling out the first electromagnetic radiation is arranged on the second substrate and is aligned depending on the beam path of the deflected first electromagnetic radiation on the second substrate, in particular without precise predefinition or determination of the first coupling-out point. In this embodiment, it suffices for the beam path of the deflected first electromagnetic radiation to run anywhere through the first coupling-out region. This makes it possible, during the alignment of the first radiation arrangement and/or of the first deflection element, to leave a leeway such that the beam path of the deflected first electromagnetic radiation can run through the first coupling-out region and/or the cutout at any desired location. The arrangement of the coupling-out optical unit can then be adapted to the beam path of the deflected first electromagnetic radiation. This makes it possible to align the first radiation source and/or the first deflection element somewhat imprecisely and nevertheless, by means of the alignment of the coupling-out optical unit relative to the beam path of the deflected first electromagnetic radiation, to enable the deflected first electromagnetic radiation to be coupled out precisely from the radiation arrangement.

The coupling-out optical unit may be an individual element or, as coupling-out optical unit, a plurality of optical elements can be coupled to one another in a respective coupling-out region one behind another in the beam direction. Alternatively or additionally, a plurality of coupling-out optical units for a corresponding plurality of coupling-out regions can be manufactured on one piece, for example in a substrate.

In various embodiments, spacers are arranged between the first substrate and the second substrate, and predefine a spacing between the first substrate and the second substrate. The spacers may be arranged for example such that, on the first substrate, a first radiation arrangement is demarcated from a second radiation arrangement. By way of example, the spacers may be arranged such that, on the first substrate, the first radiation source is demarcated from a second radiation source or that two or more radiation sources are jointly demarcated from other radiation sources. Prior to singulation of the radiation arrangements, for example on a wafer, it is thus possible to use one spacer for a plurality of radiation arrangements. The spacers may be formed for example by a lattice-shaped substrate that is placed areally onto the first substrate.

In various embodiments, the spacers are formed integrally with the second substrate. In other words, the second substrate may have the spacers. By way of example, a plurality of relatively large cutouts may be formed in the second substrate, for example in an etching process, wherein the walls of the cutouts can form the spacers. This may contribute to a simple production process.

In various embodiments, a housing is formed by the first substrate, the second substrate and the spacers. A protective atmosphere can then be formed in the housing. As protective atmosphere, by way of example, a reduced pressure may be formed in the housing. Alternatively or additionally, a protective gas may be introduced into the housing. By way of example, the protective atmosphere may have the lowest possible proportion of organic molecules. This can contribute to a long lifetime and/or to precise operation of the radiation arrangement.

In various embodiments, the housing is closed with the aid of the coupling-out optical unit. In other words, the coupling-out optical unit may be used as a cover for the housing. This may contribute to a simple production process.

In various embodiments, the first radiation source and the first deflection element are arranged on the first substrate and aligned relative to the first substrate and to one another by the first radiation source and the first deflection element firstly being arranged on a carrier substrate and being aligned relative to one another on the carrier substrate, and by the carrier substrate then being aligned on the first substrate. In other words, the first radiation source, the first deflection element and the carrier substrate can form a sub-arrangement or a module, which may then be aligned on the first substrate. This may contribute to the simple production process and/or to the precise arrangement of the first radiation source and/or of the first deflection element.

In various embodiments, a second radiation source for generating second electromagnetic radiation and/or a third radiation source for generating third electromagnetic radiation are/is arranged on the first substrate. A second and/or a third coupling-out region are/is formed in the second substrate. Subsequently, real actual positions of the second and/or third coupling-out region in the second substrate are determined. The deflected electromagnetic radiation of the second and third radiation sources is detected, as a result of which the beam paths of the second and third electromagnetic radiation can be determined. The second radiation source and/or the third radiation source are/is aligned on the first substrate depending on the actual positions of the coupling-out regions relative to the first substrate such that, with the second substrate arranged on the first substrate, the beam path of the deflected second electromagnetic radiation runs through the second coupling-out region and the beam path of the deflected third electromagnetic radiation runs through the third coupling-out region. In other words, the second and third radiation sources are arranged in a manner corresponding to the first radiation source on the first substrate. This may be done for example with the aid or without the aid of the carrier substrate, wherein, if appropriate, a dedicated carrier substrate may be used for the second and/or third radiation source. By way of example, the first radiation source can generate red light, the second radiation source may generate green light and the third radiation source can generate blue light, such that the radiation arrangement forms an RGB module and/or may serve as an RGB light source. The radiation arrangement may have a dedicated deflection element for each of the radiation sources or it may have a common deflection element for two or more radiation sources.

In various embodiments, a second deflection element is arranged for the purpose of deflecting the second electromagnetic radiation and/or a third deflection element is arranged for the purpose of deflecting the third electromagnetic radiation. The second deflection element is aligned on the first substrate relative to the first substrate and the second radiation source and/or the third deflection element is aligned on the first substrate relative to the first substrate and the third radiation source such that, with the second substrate arranged on the first substrate, the beam path of the deflected second electromagnetic radiation runs through the second coupling-out region and the beam path of the deflected third electromagnetic radiation runs through the third coupling-out region.

In various embodiments, for the purpose of combining the coupled-out first, second and/or third electromagnetic radiation, a combining optical unit is arranged above the second substrate. The combining optical unit serves for combining the coupled-out first, second and/or third electromagnetic radiation of the different radiation sources. By way of example, with the aid of the combining optical unit, a plurality of coupled-out colored light beams may be combined to form a white light beam. The combining optical unit can have one, two or more optical elements. By way of example, the combining optical unit may have a prism. By way of example, the combining optical unit can deflect the electromagnetic radiation coupled out via the coupling-out optical unit, for example by 90°, and thus guide the coupled-out electromagnetic radiation of one radiation source by way of the coupling-out optical unit of another radiation source and unite the coupled-out electromagnetic radiation of both radiation sources with one another. A combining optical unit may be provided for two, three or more radiation sources. However, a combining optical unit may also be provided for far more radiation sources, which combining optical unit may be placed for example in the form of a substrate onto the second substrate.

Various embodiments provide a radiation arrangement embodied in accordance with the method explained above.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 3 shows a plan view of a plurality of arrangements in accordance with FIG. 2;

FIG. 4 shows a side view of an exemplary embodiment of a radiation arrangement in sectional illustration;

FIG. 5 shows a side view of a further exemplary embodiment of a radiation arrangement in sectional illustration;

DETAILED DESCRIPTION

In the following detailed description, reference is made to the accompanying drawings, which form part of this description and which show, for illustration purposes, specific exemplary embodiments in which various embodiments can be implemented. In this regard, direction terminology such as, for instance, "at the top", "at the bottom", "at the front", "at the back", "front", "rear", etc. is used with respect to the orientation of the figure(s) described. Since components of exemplary embodiments can be positioned in a number of different orientations, the direction terminology serves for illustration purposes and is not restrictive in any way whatsoever. It goes without saying that other exemplary embodiments can be used and structural or logical changes can be made, without departing from the scope of protection of the disclosed embodiment. It goes without saying that the features of the various exemplary embodiments described herein can be combined with one another, unless specifically indicated otherwise. The following detailed description should therefore not be interpreted in a restrictive sense, and the scope of protection of the disclosed embodiment is defined by the appended claims.

In the context of this description, the terms "connected" and "coupled" are used to describe both a direct and an indirect connection, and a direct or indirect coupling. In the figures, identical or similar elements are provided with identical reference signs, in so far as this is expedient.

Figure 1:
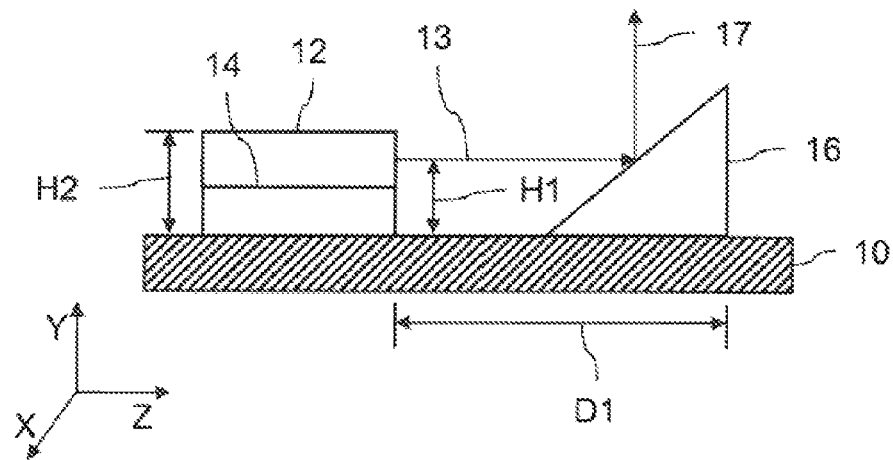
FIG. 1 shows an exemplary embodiment of an arrangement of a first radiation source and of a first deflection element.

FIG. 1 shows an exemplary embodiment of an arrangement of a first radiation source 12 and of a first deflection element 16 on a first substrate 10. The first radiation source 12 is coupled to the first substrate 10 via a heat sink 14. As an alternative thereto, the first radiation source 12 may also be directly coupled to the first substrate 10. The first deflection element 16 is coupled for example directly to the first substrate 10. The first radiation source 12 may be for example a laser, for example a laser diode. The first deflection element 16 can be for example a deflection mirror or an element having a reflective surface, for example a prism, for example a 45° prism. The first substrate 10 can be for example a wafer, for example an 8-inch wafer.

The first radiation source 12 generates first electromagnetic radiation 13, which is directed in the direction toward the first deflection element 16. The first deflection element 16 deflects the first electromagnetic radiation 13 in a direction away from the first substrate 10, such that deflected first electromagnetic radiation 17 is directed in a direction away from the first substrate 10. The first electromagnetic radiation 13 may have wavelengths in the visible range, for example. In this context, the first electromagnetic radiation can also be designated as light, for example as colored light. The first electromagnetic radiation 13 may include red, green or blue light, for example. As an alternative thereto, the first electromagnetic radiation 13 may also include infrared light or UV light.

For example if the first radiation source 12 is a laser diode, it may be necessary to keep the temperature of the laser diode low. By way of example, an electro-optical efficiency of the laser diode may depend directly on the temperature thereof, wherein the electro-optical efficiency is all the higher, the lower the temperature. A good heat dissipation can be obtained by means of the heat sink 14, for example. The material on which the heat sink 14 is placed, for example the first substrate 10, can have a high thermal conductivity, for example. As an alternative thereto, the laser diode may be placed directly onto the material having the high thermal conductivity. The heat sink 14 and/or the material having the high thermal conductivity may enable good heat spreading and/or a linking of the laser diode with a low thermal resistance value.

The first radiation source 12 emits the first electromagnetic radiation 13 at a height H1 above the first substrate 10. An upper edge of the first radiation source 12 is arranged at a second height H2 above the first substrate 10. Both the height H1 and the height H2 may fluctuate on account of production tolerances. A side of the first radiation source 12 which faces the first deflection element 16 is at a distance D1 from a side of the first deflection element 16 which faces away from the radiation source 12. The first electromagnetic radiation 13 is directed substantially in the Z-direction. A surface of the first substrate 10 extends in an X-Z plane. The deflected first electromagnetic radiation 17 is directed in the Y-direction, which is perpendicular to the surface of the first substrate 10. Consequently, a beam path of the first electromagnetic radiation 13 runs substantially parallel to the surface of the first substrate 10 and a beam path of the deflected first electromagnetic radiation 17 is substantially perpendicular to the surface of the first substrate 10.

The heat sink 14 and the first radiation source 12 may be arranged for example as a preassembled assembly jointly on the first substrate 10. The heat sink 14 may include AlN or silicon, for example. The first radiation source 12, the heat sink 14 and/or the first deflection element 16 can be arranged on the first substrate 10 by means of laser soldering, for example. The distance D1 may be chosen for example in a manner dependent on the first radiation source 12 and/or the first electromagnetic radiation 13. By way of example, for lasers of different colors, it is possible to choose a different distance D1 in each case. By way of example, the distance D1 may be predefined depending on the changed laser, and the laser can then be arranged at the distance D1 from the deflection element.

Changing the distance D1 brings about a displacement of the beam path of the deflected first electromagnetic radiation 17 in the Z-direction. The distance D1 may be changed for example by aligning the first radiation source 12 and/or the first deflection element 16. On account of the deflection of the first electromagnetic radiation 13 and on account of the possibility of changing the distance D1, a position of the beam path of the deflected first electromagnetic radiation 17 is independent of the first and/or second height H1, H2. Furthermore, on account of the use of the first deflection element 16, the optical path length of the electromagnetic radiation 13 is independent of the height H1.

Figure 2:
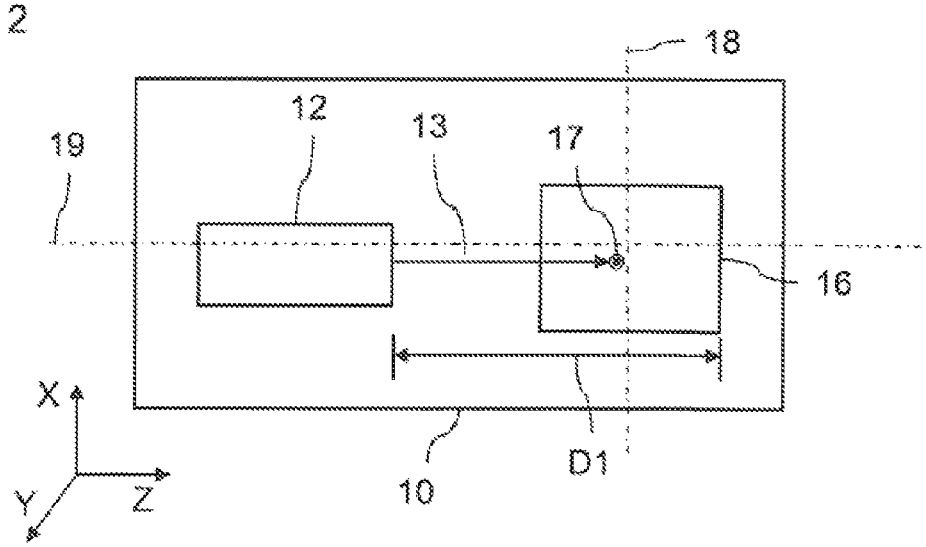
FIG. 2 shows a plan view of an exemplary embodiment of the arrangement in accordance with FIG. 1.

FIG. 2 shows a plan view of the arrangement in accordance with FIG. 1. In addition, FIG. 2 shows a first auxiliary line 18 and a second auxiliary line 19. The two auxiliary lines 18, 19 intersect at a first desired emission point. The beam path of the deflected first electromagnetic radiation 17, which is directed out of the plane of the drawing of FIG. 2 and which is represented by a circled point in FIG. 2, for example does not run through the desired emission point. The beam path of the deflected first electromagnetic radiation 17 does not run through the desired emission point for example on account of component tolerances of the first radiation source 12 and/or of the first deflection element 16.

The first radiation source 12 and/or the first deflection element 16 may be aligned on the first substrate 10 for example relative to the first substrate 10 and/or relative to one another in such a way that the beam path of the deflected first electromagnetic radiation 17 runs through the desired emission point. For this purpose, it suffices to displace the first radiation source 12 and/or the first deflection element 16 on the surface of the first substrate 10 parallel to the surface of the first substrate 10. The alignment of the first substrate 10 and/or of the first deflection element 16 can be effected for example with the aid of one, two or more horizontal stops (not illustrated). Consequently, by displacing the first radiation source 12 and/or the first deflection element 16, in particular exclusively in the X-Z plane, it is possible to align the beam path of the deflected first electromagnetic radiation in a manner corresponding to the first desired emission point.

FIG. 3 shows a further exemplary embodiment of the arrangement in accordance with FIG. 2, wherein, in this exemplary embodiment, a second radiation source 22 and a second deflection element 26 and a third radiation source 32 and a third deflection element 36 are arranged in addition to the first radiation source 12 and the first deflection element 16. As an alternative thereto, only one deflection element can be provided for two or more of the radiation sources 12, 22, 32, which will be explained in greater detail further below with reference to FIG. 10.

The second radiation source 22 generates second electromagnetic radiation 23, the beam path of which runs parallel to the surface of the first substrate 10 and which is directed toward the second deflection element 26. The second deflection element directs the second electromagnetic radiation 23 of the second radiation source 22 away from the first substrate 10 such that the deflected second electromagnetic radiation 27 of the second radiation source 22 is directed in a direction away from the first substrate 10.

The third radiation source 32 generates third electromagnetic radiation 33, the beam path of which runs parallel to the surface of the first substrate 10 and which is directed toward the third deflection element 36. The third deflection element 36 directs the third electromagnetic radiation 33 of the third radiation source 32 away from the first substrate 10 such that the deflected electromagnetic radiation 37 of the third radiation source 32 is directed in a direction away from the first substrate 10.

Furthermore, a third auxiliary line 21 and a fourth auxiliary line 25 are depicted in FIG. 3. The first auxiliary line 18 and the third auxiliary line 21 intersect at a second desired emission point, through which the beam path of the second deflected radiation 27 of the second radiation source 22 is intended to run. The first auxiliary line 18 and the fourth auxiliary line 25 intersect at a third desired emission point, through which the beam path of the deflected third electromagnetic radiation 37 of the third radiation source 32 is intended to run. Consequently, the desired emission points all lie exactly on the auxiliary line 18.

In the exemplary embodiment shown in FIG. 3, the beam paths of the deflected electromagnetic radiation 17, 27, 37 of the first, second and third radiation sources 12, 22, 32 already run through the corresponding desired emission points. Consequently, the beam paths of the deflected electromagnetic radiation 17, 27, 37 all cross the auxiliary line 18. This can contribute to the fact that a precise superimposition of the coupled-out electromagnetic radiation is subsequently possible, which will be explained in greater detail below in connection with FIG. 6. This may be achieved for example by aligning the second radiation source 22, the second deflection element 26, the third radiation source 32 and/or the third deflection element 36 in a manner corresponding to the alignment of the first radiation source 12.

Alternatively or additionally, the first radiation source 12 and the first deflection element 16 can be arranged and/or aligned on a first carrier substrate 20. The first carrier substrate 20 may then be arranged and/or aligned on the first substrate 10. Correspondingly, the second radiation source 22 and the second deflection element 26 may be arranged and/or aligned on a second carrier substrate 30, and the second carrier substrate 30 may then be arranged and/or aligned on the first substrate 10. Correspondingly, the third radiation source 32 and the third deflection element 36 may be arranged and/or aligned on a third carrier substrate 40, and the third carrier substrate 40 may then be arranged and/or aligned on the first substrate 10. If the carrier substrates 20, 30, 40 are used, then the carrier substrates 20, 30, 40 may have a good thermal conductivity, for example.

FIG. 4 shows a section through an exemplary embodiment of a radiation arrangement. The illustration shows the first radiation source 12 and the first deflection element 16 on the first carrier substrate 20. As an alternative thereto, the first carrier substrate 20 can be dispensed with. A further substrate 48 is formed between the first carrier substrate 20 and the first substrate 10, which further substrate can serve for example for making contact with the first radiation source 12. As an alternative thereto, the further substrate 48 can be dispensed with. The further substrate 48 can serve for example in a simple manner to make contact with the first radiation source 12 and/or to rapidly dissipate heat that arises. The further substrate 48 is connected to a flexible printed circuit board 44 for example via a bonding connection 46. The further substrate 48 can have a high thermal conductivity, for example.

Furthermore, spacers 52 are arranged on the further substrate. A second substrate 50 is arranged on the spacers 52. As an alternative thereto, the spacers 52 can be formed integrally with the second substrate 50. By way of example, a plurality of cutouts can be milled and/or etched into the second substrate 50, wherein the walls of the cutouts can form the spacers 52. As an alternative thereto, the spacers 52 can be formed by a lattice-shaped substrate which is arranged parallel to the first substrate 10 and the lattice of which extends over the first substrate 10 and demarcates a plurality of radiation sources and/or radiation arrangements relative to one another in a horizontal direction. The lattice-shaped substrate can be produced from a planar substrate for example in an etching process. The spacers 52 predefine a spacing between the first substrate 10 and the second substrate 50.

The first substrate 10 or, if appropriate, the further substrate 48, the spacers 52 and the second substrate 50 form a housing having an interior. At least the first radiation source 12 and the first deflection element 16 and, if appropriate, the first carrier substrate 20 are arranged in the interior. Furthermore, the second and/or the third radiation source 22, and/or the second deflection element 26, 36 can also be arranged in the housing.

The second substrate 50 has a first coupling-out region, in which a coupling-out optical unit 54 is formed and through which the beam path of the deflected first electromagnetic radiation 17 runs. The coupling-out optical unit 54 can be formed directly in the second substrate 50. By way of example, the second substrate 50 may include glass and the coupling-out optical unit 54 can be formed by thermal treatment of the second substrate 50 in the first coupling-out region. The coupling-out optical unit 54 may be formed as a focusing optical unit and focus and/or concentrate the deflected first electromagnetic radiation 17. As an alternative thereto, the coupling-out optical unit 54 may also be formed as a collimation optical unit and collimate the deflected first electromagnetic radiation 17. The coupling-out optical unit 54 may be formed for example in a lens-shaped fashion, in a disk-shaped fashion or in a rectangular fashion.

The coupling-out optical unit 54 is formed in the second substrate 50 at a predefined desired position, for example in the first coupling-out region. By way of example, the first coupling-out region may be predefined by the coupling-out optical unit 54. An actual position of the coupling-out optical unit 54 and/or of the first coupling-out region may deviate from the desired position of the first coupling-out region. The coupling-out optical unit 54 and/or the first coupling-out region may predefine and/or have a first coupling-out point, through which the beam path of the deflected first electromagnetic radiation 17 is intended to run.

The first radiation source 12 and/or the first deflection element 16 are/is arranged on or relative to the first substrate 10 such that the beam path of the deflected first electromagnetic radiation 17 runs through the first coupling-out region and/or through the first coupling-out point.

A protective atmosphere may optionally be formed in the housing. By way of example, a reduced pressure may prevail in the housing. By way of example, a pressure of between 10 and $10^{-10}$ mbar, for example between 1 and $10^{-3}$ mbar, may prevail in the housing. Alternatively or additionally, the protective atmosphere may have a particularly low proportion of organic molecules. Alternatively or additionally, the protective atmosphere may include a protective gas, for example nitrogen. The protective atmosphere may contribute for example to the emission point of the radiation arrangement remaining constant over a long lifetime. By way of example, the protective atmosphere may contribute to preventing for example particles, for example organic particles, which are attracted on account of an electromagnetic field generated by the first radiation source 12, from depositing on an optical unit of the first radiation source 12. This may be advantageous for example if the first radiation source 12 is a laser that emits green light.

FIG. 5 shows the radiation arrangement in accordance with FIG. 4, wherein a combining optical unit 56 is additionally formed on the second substrate 50. The combining optical unit 56 serves for deflecting the electromagnetic radiation coupled out through the coupling-out optical unit 54, for example such that the coupled-out electromagnetic radiation substantially runs in the combining optical unit 56. In this way, by way of example, the coupled-out electromagnetic radiation of the first, second and/or third radiation source 12, 22, 32 may be combined to form a single beam. The combined beam may include white light, for example. The combining optical unit 56 may have a prism, for example. The combining optical unit 56 can be used for a plurality of radiation arrangements for example in accordance with the second substrate 50. As an alternative thereto, the combining optical unit 56 can be used only for one radiation arrangement. The combined beam may predefine an emission point of the radiation arrangement, for example.

Figure 6:
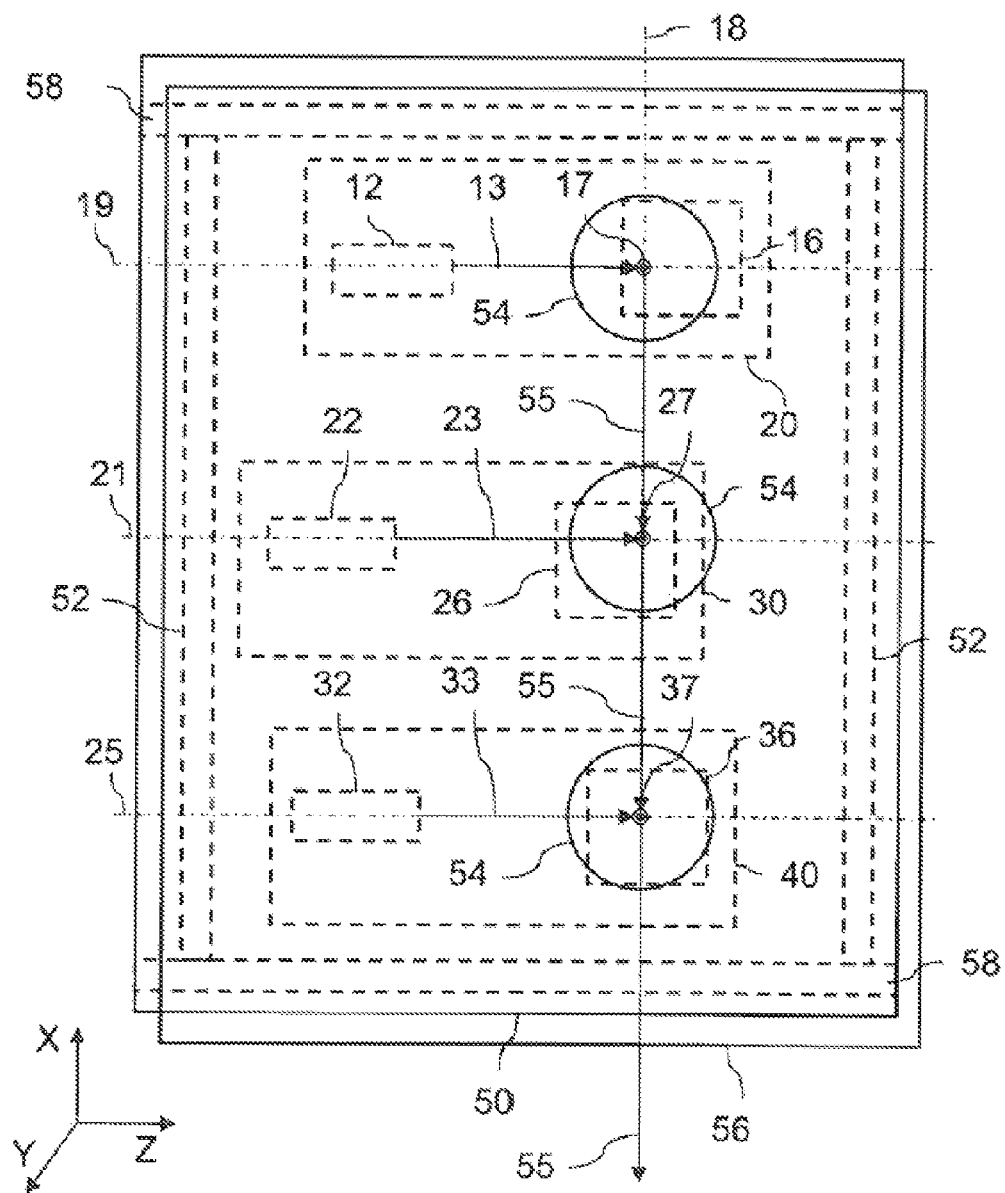
FIG. 6 shows a plan view of an exemplary embodiment of the radiation arrangement in accordance with FIG. 5.

FIG. 6 shows a plan view of the radiation arrangement in accordance with FIG. 5. For each of the radiation sources 12, 22, 32 and, in particular, for each deflected electromagnetic radiation 17, 27, 37 and thus for each actual emission point of the radiation sources 12, 22, 32, a corresponding coupling-out optical unit 54 is arranged in a corresponding coupling-out region. By way of example, the second substrate 50 has a second coupling-out region in a manner corresponding to the second radiation source 22 and a third coupling-out region in a manner corresponding to the third radiation source 32. The second and third coupling-out regions may have a second and third coupling-out point, respectively, in a manner corresponding to the first coupling-out region. The radiation sources 12, 22, 32 and the deflection elements 16, 26, 36 are arranged such that the beam paths of the deflected electromagnetic radiation run centrally through the coupling-out optical units 54, for example exactly through the corresponding coupling-out points of the corresponding coupling-out regions. By way of example, the beam paths cross the auxiliary line 18. The electromagnetic radiation 55 of the radiation sources 12, 22, 32 that is coupled out through the coupling-out optical units 54 is exactly superimposed with the aid of the combining optical unit and deflected and thus combined by the combining optical unit 56 parallel to the surface of the first substrate 10. The combined coupled-out electromagnetic radiation 55 predefines the emission point of the radiation arrangement. In other words, a beam path of the coupled-out electromagnetic radiation passes through the emission point of the radiation arrangement.

In addition to the spacers 52, further spacers 58 are arranged on the first substrate 10. The spacers 52, 58 serve for demarcating the radiation sources 12, 22, 32 in a housing from other radiation sources (not illustrated) of other radiation arrangements (not illustrated) on the first substrate 10.

Figure 7:
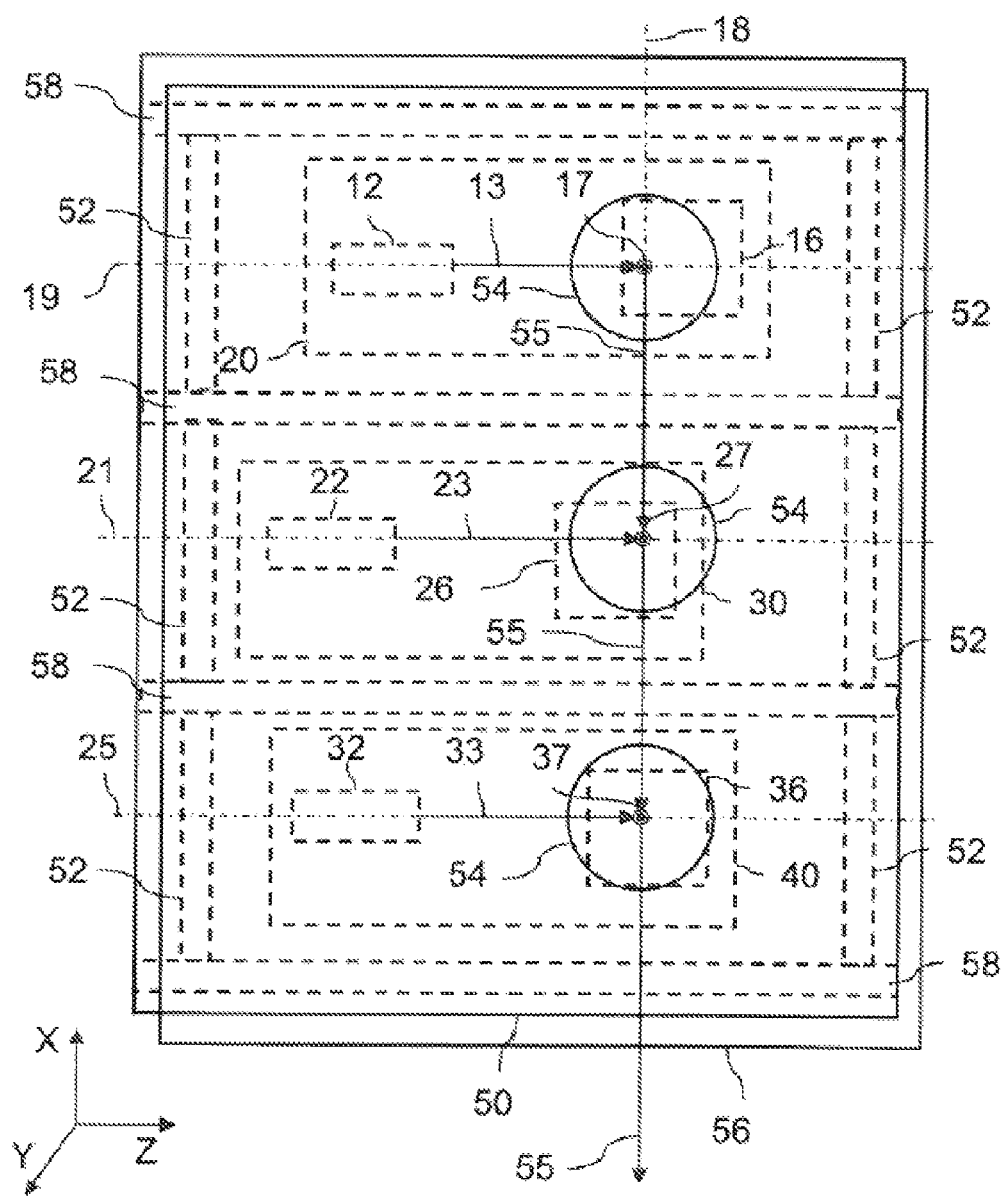
FIG. 7 shows a plan view of a further exemplary embodiment of the radiation arrangement in accordance with FIG. 5.

FIG. 7 shows an exemplary embodiment of the radiation arrangement which largely corresponds to the exemplary embodiment shown in FIG. 6, wherein, in contrast thereto, in the exemplary embodiment shown in FIG. 7, each of the radiation sources 12, 22, 32 is demarcated in an individual housing by corresponding spacers 52. As an alternative thereto, it is also possible to demarcate exactly two of the radiation sources 12, 22, 32 in an individual housing. Arranging the radiation sources 12, 22, 32 in a respective individual housing can contribute, for example, to simplifying a manner of making electrical contact with the radiation sources 12, 22, 32.

Figure 8:
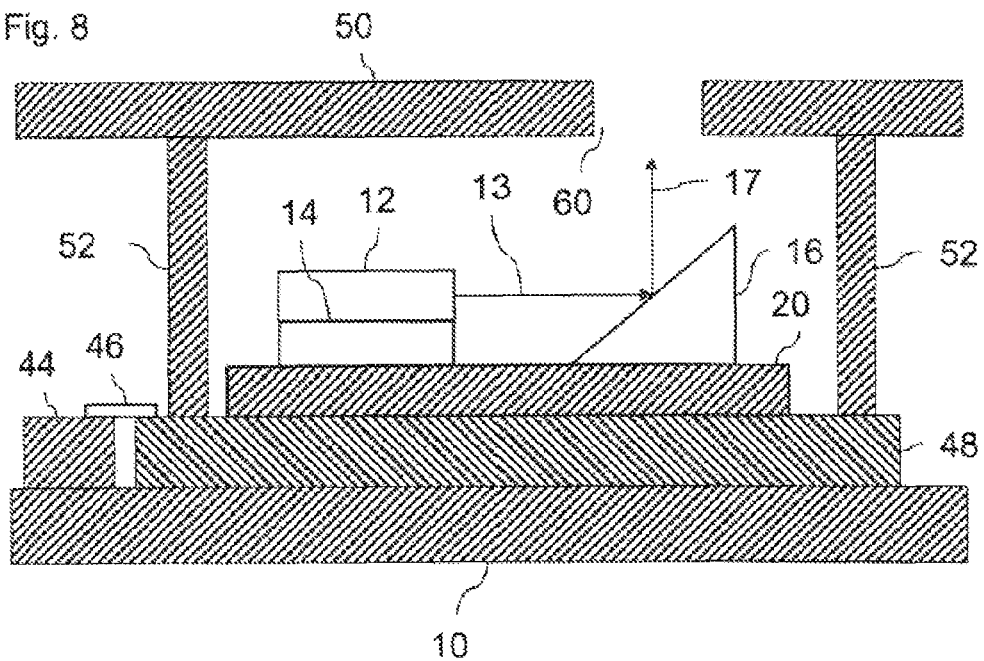
FIG. 8 shows a side view of a further exemplary embodiment of a radiation arrangement in sectional illustration.

FIG. 8 shows an exemplary embodiment of the radiation arrangement which largely corresponds to the exemplary embodiment shown in FIG. 4, wherein, in contrast thereto, in the exemplary embodiment shown in FIG. 8, a cutout 60 is formed in the first coupling-out region of the second substrate 50. By way of example, the first coupling-out region is formed by the cutout. By way of example, the first coupling-out region can be predefined by the cutout. An actual position of the cutout and/or of the first coupling-out region may deviate from the desired position of the first coupling-out region. The cutout and/or the first coupling-out region may predefine and/or have a first coupling-out point, through which the beam path of the deflected first electromagnetic radiation 17 is intended to run. As an alternative thereto, in this exemplary embodiment, it is possible to dispense with predefining a precise coupling-out point, wherein it suffices for the beam path of the deflected first electromagnetic radiation 17 to run through the first coupling-out region.

Figure 9:
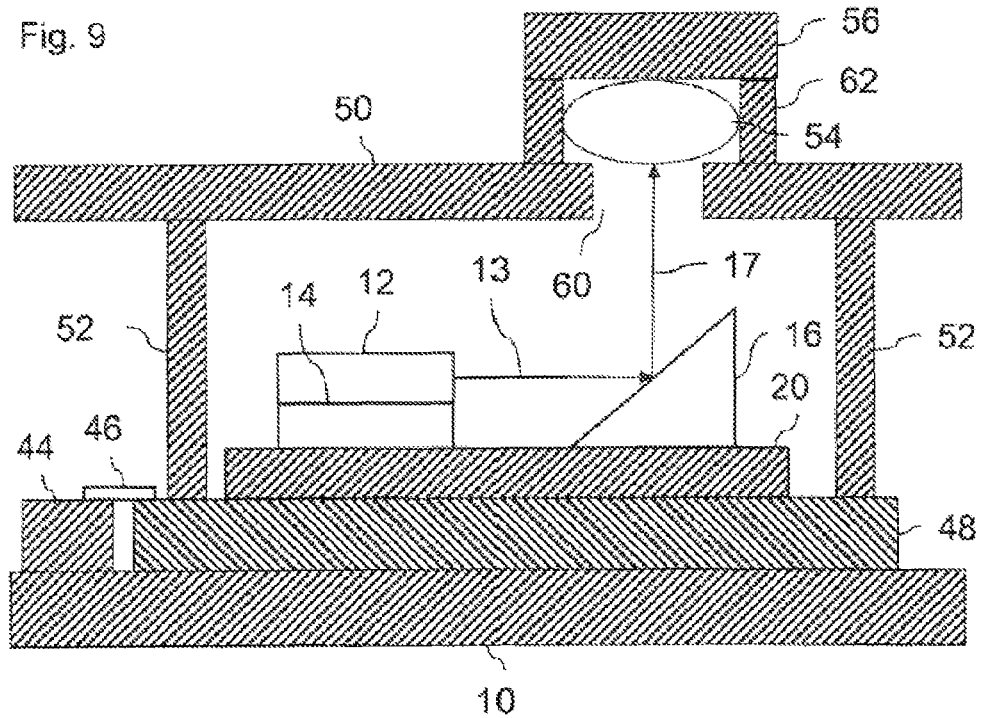
FIG. 9 shows a side view of a further exemplary embodiment of a radiation arrangement in sectional illustration.

FIG. 9 shows an exemplary embodiment of the radiation arrangement which largely corresponds to the exemplary embodiment shown in FIG. 8, wherein, in contrast thereto, in the exemplary embodiment shown in FIG. 9, the coupling-out optical unit 54 is arranged in a manner overlapping the cutout 60 on the second substrate 50. The coupling-out optical unit 54 may be held by a holding body 62, for example. Furthermore, the combining optical unit 56 may be arranged above the coupling-out optical unit 54. The coupling-out optical unit 54 is arranged for example in a manner dependent on the beam path of the deflected first electromagnetic radiation 17. If the beam path of the deflected first electromagnetic radiation 17 does not run centrally through the cutout 60, then the coupling-out optical unit 54 may also not be arranged concentrically with respect to the cutout. For aligning the coupling-out optical unit 54 with respect to the first coupling-out point and/or the first coupling-out region and/or the beam path of the deflected first electromagnetic radiation 17, it suffices to displace the coupling-out optical unit parallel to the X-Z plane.

Figure 10:
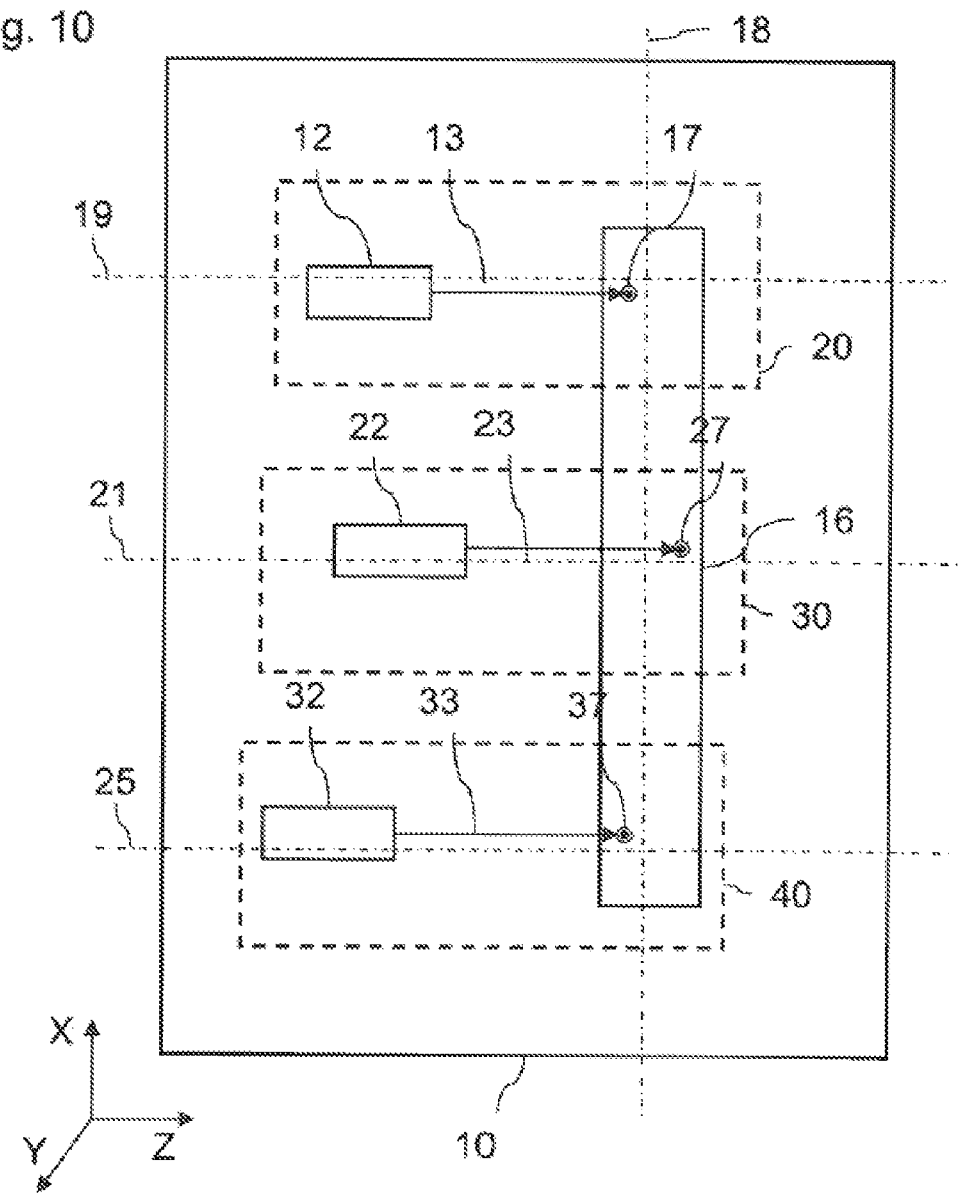
FIG. 10 shows a plan view of a further exemplary embodiment of the arrangement in accordance with FIG. 1.

FIG. 10 shows an exemplary embodiment of the radiation arrangement which largely corresponds to the exemplary embodiment shown in FIG. 3, wherein, in contrast thereto, in the exemplary embodiment shown in FIG. 10, optionally only the first deflection element 16 is arranged for all the radiation sources 12, 22, 32 and wherein the beam paths of the deflected electromagnetic radiation do not run exactly through the desired emission points. By way of example, the beam paths of the deflected electromagnetic radiation do not cross the auxiliary line 18. By way of example, the beam paths of the deflected electromagnetic radiation may be at a predefined maximum distance from the corresponding desired emission points. By way of example, the maximum distance may be 100 µm or 10 µm. This leeway simplifies an alignment of the radiation sources 12, 22, 32 and/or of the deflection elements 16, 26, 36. As an alternative to the one first deflection element 16, it is also possible to arrange the second and/or the third deflection element 26, 36.

Figure 11:
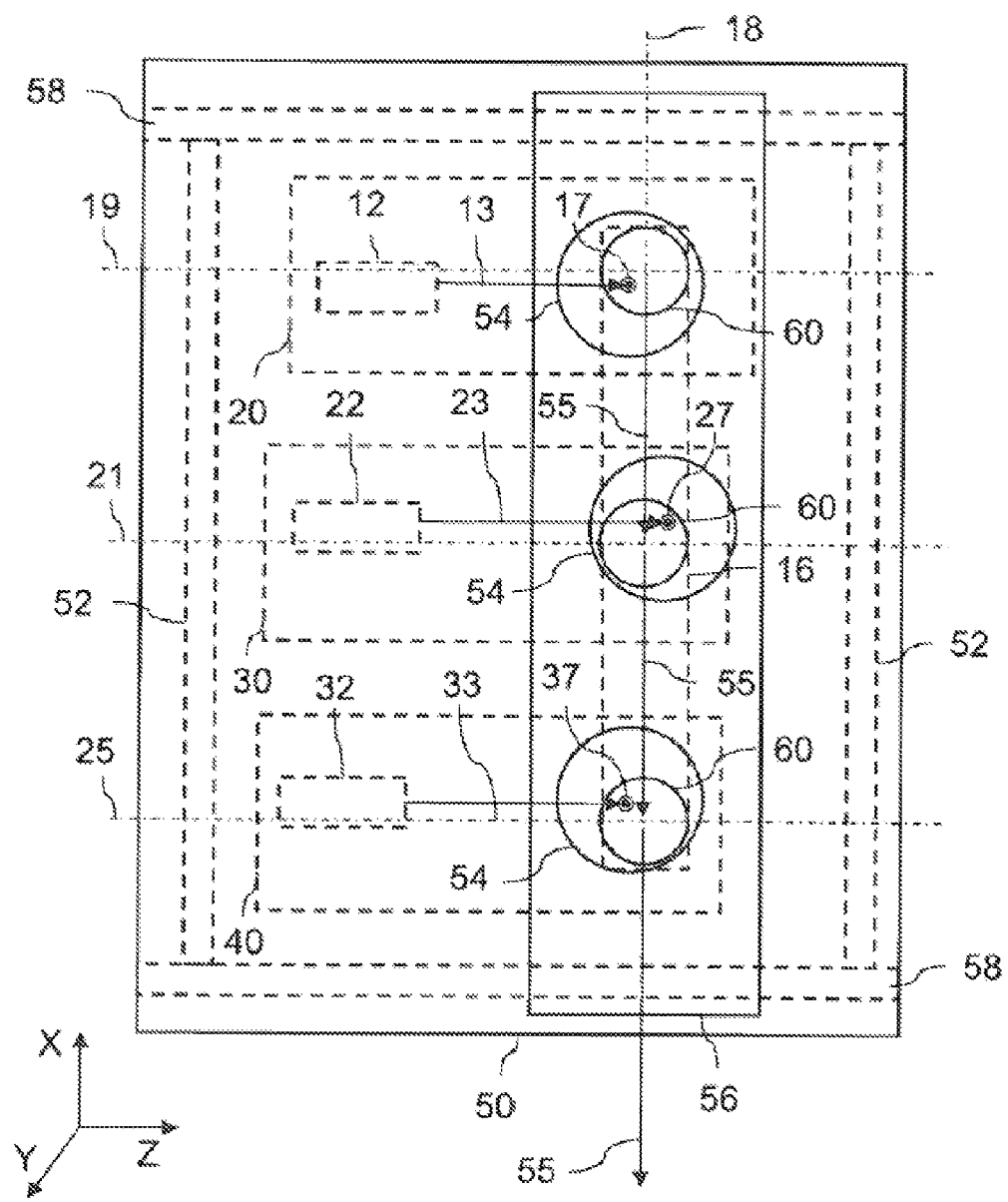
FIG. 11 shows a plan view of an exemplary embodiment of the radiation arrangement in accordance with FIG. 9.

FIG. 11 shows a plan view of the radiation arrangement in accordance with FIGS. 9 and 10, which reveals that the beam paths of the deflected electromagnetic radiation do not run in a centered manner through the coupling-out regions and the coupling-out optical units 54 are nevertheless arranged concentrically with the beam paths of the deflected electromagnetic radiation. Consequently, the coupling-out optical units 54 are arranged in a slightly displaced manner above the corresponding cutouts 60. The combining optical unit 56 extends for example over the three coupling-out optical units 54 shown.

Figure 12:
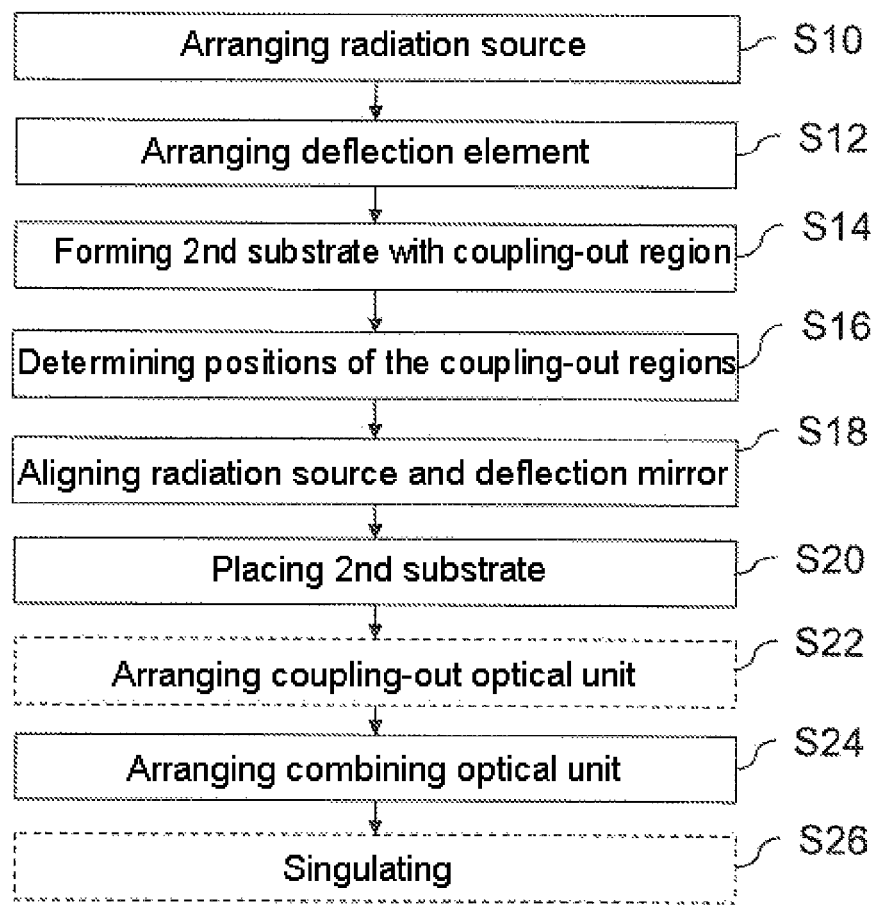
FIG. 12 shows a flowchart of an exemplary embodiment of a method for producing a radiation arrangement.

FIG. 12 shows a flowchart of an exemplary embodiment of a method for producing the radiation arrangement. The method serves for example to adapt the beam paths of the deflected electromagnetic radiation precisely to the desired emission points and/or to produce a radiation arrangement having a precise emission point. Furthermore, the method can serve for example to restrict an alignment of the elements which are important for the positioning of the emission point of the radiation arrangement, for example the radiation sources 12, 22, 32 and/or the deflection elements 16, 26, 36 and/or the coupling-out optical units 54, to alignment and/or displacement of the corresponding elements parallel to the X-Y plane. This alignment may be facilitated with the aid of horizontal stops, which may contribute to simple, fast and high-precision production of the radiation arrangement.

In a step S10, at least one radiation source is arranged on at least one first substrate, for example the first radiation source 12 is arranged on the first substrate 10. Furthermore, the second radiation source 22 and/or the third radiation source 32 may also be arranged on the first substrate 10. Furthermore, the radiation sources 12, 22, 32 may also be arranged on the corresponding carrier substrates 20, 30, 40, which are then arranged on the first substrate 10. Furthermore, the carrier substrates 20, 30, 40 may also be arranged on the further substrate 48, which may then be arranged on the first substrate 10. The radiation sources 12, 22, 32 can be fixed by means of laser soldering, for example. By way of example, the radiation sources 12, 22, 32 may form an RGB module.

A step S12 involves arranging at least one deflection element, for example the first deflection element 16, the second deflection element 26 and/or the third deflection element 36. The deflection elements 16, 26, 36 may be arranged in a manner corresponding to the radiation sources 12, 22, 32 directly on the first substrate 10 or on the carrier substrates 20, 30, 40. The radiation sources 12, 22, 32 and the corresponding deflection elements 16, 26, 36 are arranged at the correspondingly predefined distance D1 from one another. The deflection elements 16, 26, 36 can be fixed by means of laser soldering, for example.

A step S14 involves providing a second substrate, for example the second substrate 50, wherein the coupling-out regions are formed in the second substrate 50. The coupling-out regions may have for example the coupling-out optical units 54 and/or the cutouts 60. The coupling-out optical units 54 may be formed for example directly in the second substrate 50 or can be arranged directly in the second substrate 50. Furthermore, the coupling-out optical units 54 may be arranged above the cutouts 60, which will be explained below in connection with a step S22.

A step S16 involves determining the actual positions of the coupling-out region in the second substrate 50. For this purpose, by way of example, the second substrate 50 can be measured. As an alternative thereto, it is possible to measure the tool for producing the second substrate 50, wherein the data obtained in the process, in particular the actual positions, are stored and, when the method is processed repeatedly, may be determined and used again and again by loading the data. When the method is processed repeatedly, the determination of the actual positions of the coupling-out regions in step S16 is then restricted to the loading of the corresponding data previously detected and stored.

A step S18 involves aligning the radiation sources 12, 22, 32 and/or the deflection elements 16, 26, 36. By way of example, the radiation sources 12, 22, 32 and/or the deflection elements 16, 26, 36 are aligned directly on the first substrate and/or the further substrate 48 or the carrier substrates 20, 30, 40 are correspondingly aligned with the radiation sources 12, 22, and/or deflection elements 16, 26, 36 arranged on said carrier substrates. During the alignment, the positions of the radiation sources 12, 22, 32 and/or of the deflection elements 16, 26, 36 and thus the courses of the beam paths of the deflected electromagnetic radiation 17, 27, 37 are checked repeatedly, for example continuously, for example by generating the electromagnetic radiation 13, 23, 33 with the aid of the radiation sources 12, 22, 32 and detecting the deflected electromagnetic radiation 17, 27, 27 with the aid of light-sensitive sensors and evaluating the measurement signal of the sensors. In other words, the alignment of the radiation sources 12, 22, 32 and/or of the deflection elements 16, 26, 36 may be effected in principle in accordance with a closed-loop control until the beam paths of the deflected electromagnetic radiation 17, 27, 37 run through the desired emission points and/or until the beam paths of the deflected electromagnetic radiation 17, 27, 37 run through the corresponding coupling-out regions.

In a step S20, the second substrate 50 with the coupling-out regions is placed onto the first substrate 10, wherein the spacers 52 space apart the first substrate 10 from the second substrate 50. If the second substrate 50 terminates the housing thereby formed, then in step S20 the protective atmosphere may be formed in the housing, for example by the second substrate 50 being placed onto the first substrate 10 in the protective atmosphere and part of the protective atmosphere thereby being enclosed in the housing. One, two or all three of the radiation sources 12, 22, 32 may be arranged in the housing.

If the coupling-out optical units 54 are not arranged in the second substrate 50, then in a step S22 the coupling-out optical units 54 may be placed on the second substrate. The coupling-out optical units 54 may be arranged for example in a manner corresponding to the coupling-out regions, the coupling-out points and/or the actual emission points. If the coupling-out optical units 54 terminate the housing or housings, then in step S22 the protective atmosphere may be formed in the housing or housings prior to the placement of the coupling-out optical units 54. By way of example, the coupling-out optical units 54 can be placed onto the second substrate 50 in the protective atmosphere, such that part of the protective atmosphere is enclosed in the housing or housings.

In a step S24, the combining optical unit 56 may be arranged above the coupling-out optical units 54, as a result of which the coupled-out electromagnetic radiation 55 is combined and the emission point of the radiation arrangement is predefined.

If the steps explained above are processed simultaneously for a plurality of radiation arrangements, for example on a wafer, for example on the first substrate 10, then the radiation arrangements may be singulated in a step S26. By way of example, each radiation arrangement may constitute an RGB module. The radiation arrangements may be singulated for example by sawing the first and second substrates 10, 50 and/or the spacers 52.

FIGS. 1 to 11 illustrate different advances of different exemplary embodiments of the method in accordance with FIG. 12.

Various embodiments are not restricted to the exemplary embodiments specified. By way of example, the exemplary embodiments shown can be combined with one another.

The invention claimed is:

1. A method for producing a radiation arrangement, the method comprising:
providing a first substrate,
arranging a first radiation source for generating first electromagnetic radiation on the first substrate,
arranging a first deflection element configured to deflect a beam path of the first electromagnetic radiation away from the first substrate,
providing a second substrate,
forming a first coupling-out region in the second substrate at a predefined desired position,
determining an actual position of the first coupling-out region relative to the first substrate,
detecting a beam path of the deflected first electromagnetic radiation,
aligning the first radiation source and the first deflection element on the first substrate such that the beam path of the deflected first electromagnetic radiation and the determined actual position of the first coupling-out region are aligned relative to one another, and
arranging the second substrate on the first substrate.

2. The method as claimed in claim 1, wherein at least one of the first radiation source and the first deflection element is aligned on the first substrate by being displaced on the first substrate parallel to a surface of the first substrate.

3. The method as claimed in claim 1, wherein the first coupling-out region has a first coupling-out point, and wherein the first radiation source and the first deflection element are aligned on the first substrate such that, with the second substrate arranged on the first substrate, the beam path of the deflected first electromagnetic radiation runs through the coupling-out point.

4. The method as claimed in claim 3, wherein the first coupling-out region is formed in the second substrate by a coupling-out optical unit for coupling out the deflected first electromagnetic radiation being formed in the second substrate, wherein the coupling-out optical unit forms the first coupling-out region and has the first coupling-out point.

5. The method as claimed in claim 3, wherein the first coupling-out region is formed in the second substrate by a cutout for coupling out the deflected first electromagnetic radiation being formed in the second substrate, wherein the cutout forms the first coupling-out region and includes the first coupling-out point, and wherein a coupling-out optical unit is arranged in a manner overlapping the cutout on the second substrate and is aligned depending on the first coupling-out point on the second substrate.

6. The method as claimed in claim 1, wherein the first coupling-out region is formed in the second substrate by a cutout for coupling out the deflected first electromagnetic radiation being formed in the second substrate, and wherein a coupling-out optical unit for coupling out the deflected first electromagnetic radiation is arranged on the second substrate and is aligned depending on the beam path of the deflected electromagnetic radiation on the second substrate.

7. The method as claimed in claim 1, wherein spacers are arranged between the first substrate and the second substrate, and predefine a spacing between the first substrate and the second substrate.

8. The method as claimed in claim 7, wherein the spacers are formed integrally with the second substrate.

9. The method as claimed in claim 7, wherein a housing is formed by the first substrate, the second substrate and the spacers, and wherein a protective atmosphere is formed in the housing.

10. The method as claimed in claim 9, wherein the housing is closed with the aid of the coupling-out optical unit.

11. The method as claimed in claim 1, wherein the first radiation source and the first deflection element are arranged on the first substrate and aligned relative to the first substrate and to one another by the first radiation source and the first deflection element firstly being arranged on a first carrier substrate and being aligned relative to one another on the first carrier substrate, and by the first carrier substrate then being aligned on the first substrate.

12. The method as claimed in claim 1, further comprising:
arranging a second radiation source for generating second electromagnetic radiation and a third radiation source for generating third electromagnetic radiation on the first substrate,
forming at least one of a second and a third coupling-out region in the second substrate,
determining actual positions of at least one of the second and third coupling-out region relative to the first substrate,
detecting a beam path of at least one of the deflected second and third electromagnetic radiation, and
aligning at least one of the second radiation source and the third radiation source on the first substrate such that the beam path of at least one of the deflected second and third electromagnetic radiation and the determined actual positions of said at least one of the second and third coupling-out region are aligned, respectively relative to one another.

13. The method as claimed in claim 12, wherein at least one of a second deflection element is arranged for the purpose of deflecting the electromagnetic radiation of the second radiation source and a third deflection element is arranged for the purpose of deflecting the electromagnetic radiation of the third radiation source, and wherein said at least one of the second deflection element and the third deflection element is aligned on the first substrate relative to the second radiation source and the third radiation source, respectively, such that, with the second substrate arranged on the first substrate, the beam path of the deflected second electromagnetic radiation runs through the second coupling-out region and the beam path of the deflected third electromagnetic radiation runs through the third coupling-out region.

14. The method as claimed in claim 1, wherein, for the purpose of combining the coupled-out electromagnetic radiation, a combining optical unit is arranged above the second substrate.

15. The method as claimed in claim 1, wherein the first deflection element is arranged in a configuration to deflect a beam path of the first electromagnetic radiation away from the first substrate immediately upon contact of the beam path of the first electromagnetic radiation with the deflection element.

16. The method as claimed in claim 1, wherein the first deflection element is a first deflection mirror.

17. A radiation arrangement embodied by a method for producing a radiation arrangement, the method comprising:
providing a first substrate,
arranging a first radiation source for generating first electromagnetic radiation on the first substrate,
arranging a first deflection element configured to deflect a beam path of the first electromagnetic radiation away from the first substrate,
providing a second substrate,
forming a first coupling-out region in the second substrate at a predefined desired position,
determining an actual position of the first coupling-out region relative to the first substrate,
detecting a beam path of the deflected first electromagnetic radiation,
aligning the first radiation source and the first deflection element on the first substrate such that the beam path of the deflected first electromagnetic radiation and the determined actual position of the first coupling-out region are aligned relative to one another, and
arranging the second substrate on the first substrate.

18. The radiation arrangement as claimed in claim 17, wherein the first deflection element is arranged in a configuration to deflect a beam path of the first electromagnetic radiation away from the first substrate immediately upon contact of the beam path of the first electromagnetic radiation with the deflection element.

* * * * *